(12) United States Patent
Yokomizo et al.

(10) Patent No.: US 7,737,733 B2
(45) Date of Patent: Jun. 15, 2010

(54) CURRENT-VOLTAGE CONVERSION CIRCUIT

(75) Inventors: Ichiro Yokomizo, Kyoto (JP); Yutaka Shibata, Kyoto (JP)

(73) Assignee: Rohm Co., Ltd. (JP)

( * ) Notice: Subject to any disclaimer, the term of this patent is extended or adjusted under 35 U.S.C. 154(b) by 324 days.

(21) Appl. No.: 11/995,644

(22) PCT Filed: Jul. 11, 2006

(86) PCT No.: PCT/JP2006/313792

§ 371 (c)(1),
(2), (4) Date: Jan. 14, 2008

(87) PCT Pub. No.: WO2007/007765

PCT Pub. Date: Jan. 18, 2007

(65) Prior Publication Data

US 2009/0259418 A1 Oct. 15, 2009

(30) Foreign Application Priority Data

Jul. 12, 2005 (JP) .............................. 2005-203553

(51) Int. Cl.
*H02M 11/00* (2006.01)
(52) U.S. Cl. ........................ 327/103; 327/538; 327/541
(58) Field of Classification Search ....................... None
See application file for complete search history.

(56) References Cited

U.S. PATENT DOCUMENTS

| 5,231,316 A * | 7/1993 | Thelen, Jr. .................. 327/103 |
| 6,249,162 B1 * | 6/2001 | Inoue .......................... 327/205 |
| 6,522,175 B2 * | 2/2003 | Ueno et al. .................. 327/103 |
| 7,102,335 B1 * | 9/2006 | Solie .......................... 323/273 |

FOREIGN PATENT DOCUMENTS

| JP | 60-47505 A | 3/1985 |
| JP | 8-17066 A | 1/1996 |
| JP | 8-33213 A | 2/1996 |
| JP | 2000-166279 A | 6/2000 |

OTHER PUBLICATIONS

International Search Report for International Application No. PCT/JP2006-313792 mailed Oct. 17, 2006.
Written Opinion of the International Searching Authority for PCT/JP2006-313792 mailed Oct. 17, 2006.

* cited by examiner

*Primary Examiner*—Tuan Lam
(74) *Attorney, Agent, or Firm*—Cantor Colburn, LLP

(57) ABSTRACT

A current-voltage conversion circuit which converts a current to be detected into a voltage, includes a detection resistor, amplifier circuit having a first operational amplifier, and an offset adjusting current source having a third resistor and a fourth resistor which are capable of trimming. The offset adjusting current source causes an offset adjustment current to flow in the offset resistor. The current value of the offset adjustment current is controlled by adjusting the resistance of the third resistor and the fourth resistor. A voltage at a node between the first transistor and the second resistor is output.

5 Claims, 3 Drawing Sheets

CURRENT-VOLTAGE CONVERSION CIRCUIT

CROSS REFERENCE TO RELATED APPLICATIONS

This is a U.S. national stage of application No. PCT/JP2006/313792, filed on 11 Jul. 2006. Priority under 35 U.S.C. §119(a) and 35 U.S.C. §365(b) is claimed from Japanese Application No. 2005-203553, filed 12 Jul. 2005, the disclosure of which is also incorporated herein by reference.

BACKGROUND OF THE INVENTION

1. Field of the Invention

The present invention relates to the current-voltage conversion circuit which converts the current to be detected into voltage.

2. Description of the Related Art

In regards to battery driven electronic equipment such as Portable mobile phones, PDA (Personal Digital Assistant) and portable CD players and the likes, it is necessary to manage the battery which is the drive source of the load by monitoring power consumption of the load or monitoring the level of the battery.

In that case, it uses the current-voltage conversion circuit and transforms the load current supplied to the load from the battery into voltage and is thought to be a method capable of monitoring the supplied load current from the battery based on this converted voltage. There is a document in regards to the current-voltage conversion circuit in the following.

(for example, see Japanese Patent Laid-Open No. 8-17066).

The load circuit uses the current-voltage conversion circuit as a method of converting load current into voltage, providing detection resistor to the path of the load current, and this is thought to be a method capable of monitoring the voltage drop across the detection resistor. In order for this detection resistor to function as a voltage loss, it is necessary to set a small value for this resistance value and the voltage drop becomes a very small value. In order for this kind of small voltage drop A/D conversion, it is necessary to amplify the voltage, once, by way of the operational amplifier.

However, when using an operational amplifier in amplifying voltage, offset voltage of the operational amplifier becomes a problem. With offset voltage, if there is a negative voltage shift in the amplified voltage, when the voltage drop across the resistor is larger than 0, (namely, when the load current that is detected is larger than 0), the amplified voltage may become 0. As a result, when there is little current detection supplied to the load from the battery there are times when that current cannot be detected (below, this range of current which cannot be detected is called the "undetectable current region").

SUMMARY OF THE INVENTION

The present invention has been made in light of the these problems, and a general purpose thereof is to provide the current-voltage conversion circuit in which undetectable current region due to the offset voltage of the operational amplifier is reduced.

One embodiment of this present invention is the current voltage conversion circuit that converts the current to be detected into voltage. The circuit comprises: a detection resistor provided on a path through which the current to be detected flows; a first resistor, a first transistor and a second transistor connected in series between a high-potential first terminal of the detection resistor and a first fixed voltage terminal; a first operational amplifier which has its output terminal connected to the control terminal of the first transistor, and has its inverting input terminal connected to a node between the first resistor and the first transistor; an offset resistor which is provided between a low-potential second terminal of the detection resistor and the non-inverting input terminal of the first operational amplifier; an offset adjusting current source which includes a trimmable resistor and causes an offset adjustment current to flow in the offset resistor, the current value of the offset adjustment current being controlled by adjusting the resistance of the resistors, wherein a voltage at a node between the first transistor and the second resistor is output.

According to this current voltage conversion circuit, by adjusting the current flow to the resistance offset, the voltage drop that occurs from the offset resistor can be adjusted and can cancel the first operational amplifier's offset voltage. As a result, there is no undetectable current region and a current voltage conversion that is of good precise detection is possible. In addition, by adjusting the current flow to the offset resistor, the detected current, and the voltage connection of the first transistor and the second resistor, can obtain a relationship of direct proportion and is convenient.

The offset adjusting current source may comprise: a reference voltage circuit; third and fourth resistors which divide a reference voltage output from the reference voltage circuit; a second transistor and a fifth resistor connected in series between the non-inverting input terminal of the first operational amplifier and a second fixed voltage terminal; and an operational amplifier which receives the reference voltage at the non-inverting input terminal, has its inverting input terminal connected to a node between the second transistor and the fifth resistor, and has its output terminal connected to the control terminal of the second transistor, wherein at least one of the third resistor and the fourth resistor is trimmable.

By adjusting the resistance value of at least one of the third resistor and the fourth resistor, the ratio by which the reference voltage is divided can be controlled. Therefore, the adjustment current which flows in the offset can be adjusted easily.

The first resistor, the second resistor, the first operational amplifier, the offset resistor and the offset adjusting current source may be integrated on a semiconductor substrate.

Furthermore, "integration" may mean formation of all of the components of the circuit on the semiconductor substrate or integration of principal components of the circuit. Some resistors used to adjust a circuit constant and the likes may be provided outside the semiconductor substrate.

By integrating the components on one semiconductor substrate, mounting on electronic equipment becomes easy.

Another embodiment of the present invention is a power consumption detection circuit. The power consumption detection circuit comprises: the current voltage conversion circuit which detects a current that flows in a load circuit; an analog to digital converter which subjects an output voltage of the current voltage conversion circuit to analog to digital conversion; and a processing unit which determines power consumption of the load circuit by referring to the value of the output voltage subjected to analog to digital conversion by the analog to digital converter.

According to this embodiment, the current that flows in the load circuit is converted, before being subject to analog to digital conversion, into voltage through high-precision current-to-voltage conversion with no undetectable current region. Thus, the load circuit's electrical power consumption can be determined precisely. In addition, by adjusting the current flowing in the offset resistor so that the current to be detected and the voltage at a node between the first transistor and second resistance is in a proportional relationship, the voltage value subjected to analog to digital conversion need not be corrected. In this way, a low-cost power consumption detection circuit is realized.

Furthermore another embodiment of this invention is electronic equipment. The electronic equipment comprises: a battery; a load circuit driven by the battery; and the power consumption detection circuit which detects power consumption of the load circuit, wherein the processing unit of the power consumption detection circuit determines the remaining capacity of the battery by referring to the power consumption of the load circuit.

According to this embodiment, since the power consumption of the load circuit can be determined precisely, remaining capacity of the electric battery can be determined accurately, easing battery maintenance. In addition, since the power consumption detector can be produced at low cost as described above, the cost of the electronic equipment as a whole is held down as well.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

The present embodiment, for example regards battery-driven electronic equipment such as portable mobile phones and portable CD players. This electronic equipment specifies the power consumption at load by monitoring the current from the battery to the load, and has the ability to detect remaining voltage. The current-voltage conversion circuit according to the embodiment being explained below, mounted in this kind of electronic equipment converts and amplifies the current that flows to the load into voltage.

Figure 1:
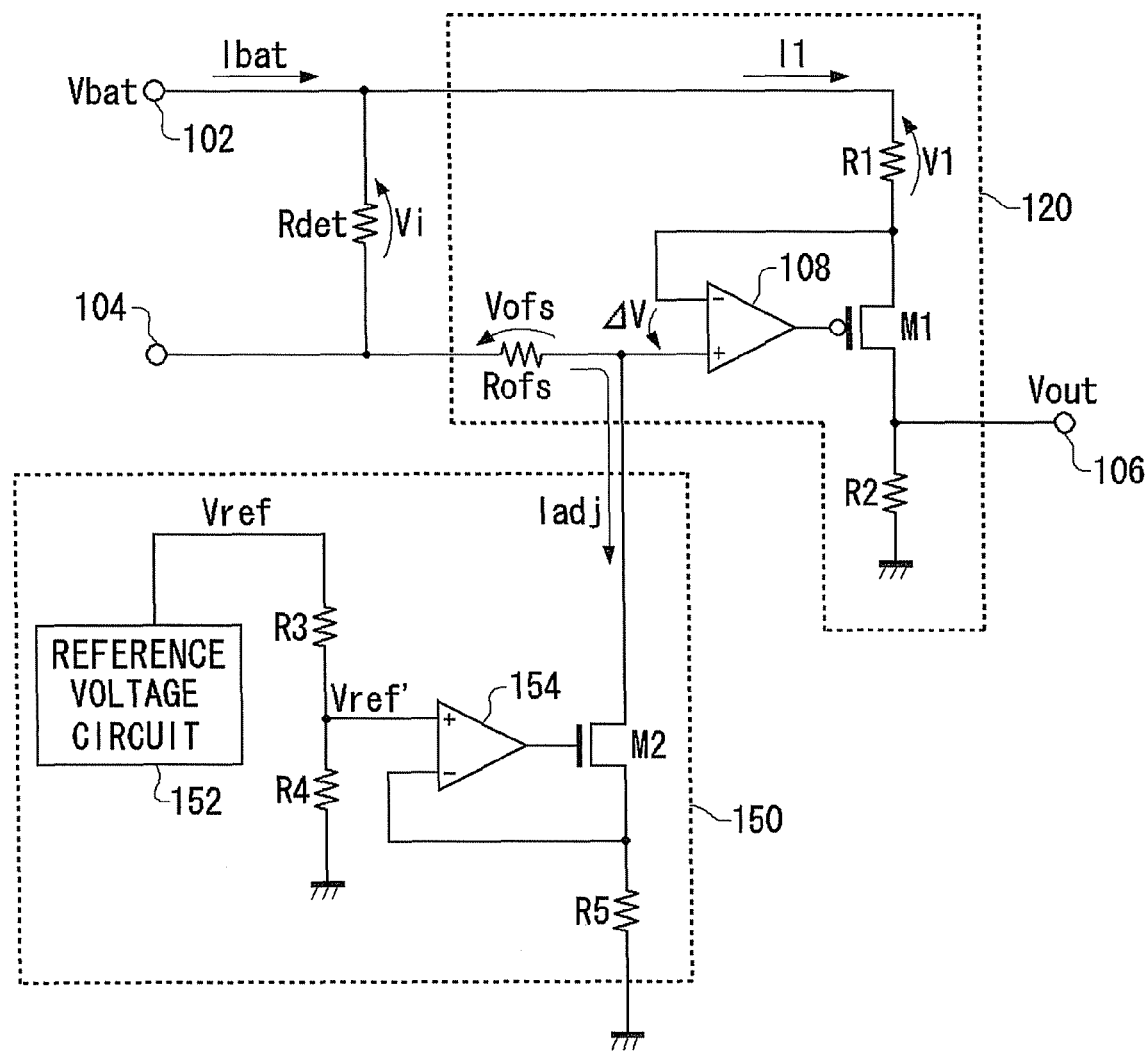
FIG. 1 is a schematic diagram showing the constitution of the current-voltage conversion circuit according to one embodiment.
Figure 2:
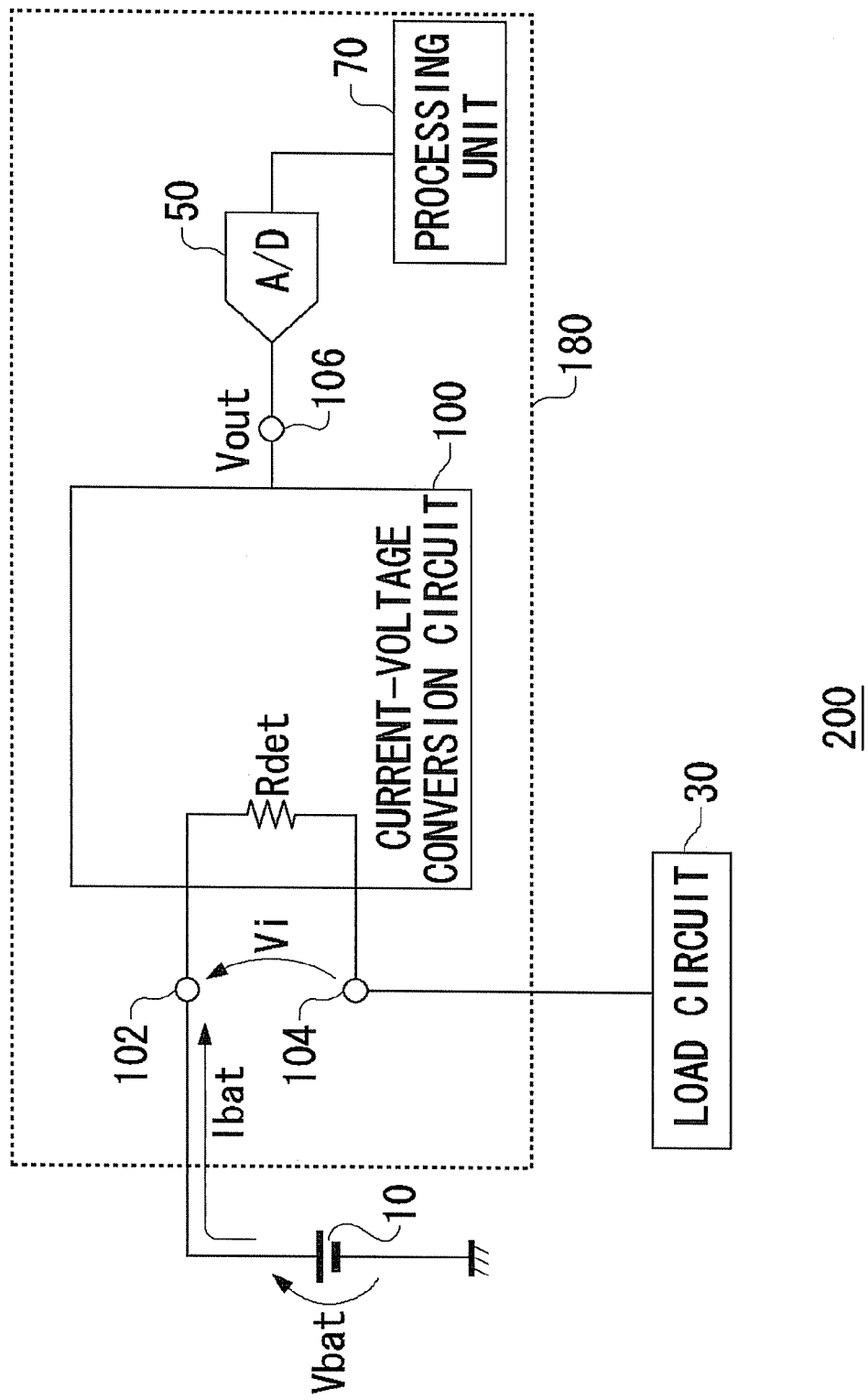
FIG. 2 is a block diagram showing the constitution of the electronic equipment that loads the current-voltage conversion circuit in FIG. 1.

FIG. 1 shows the constitution of the current-voltage conversion circuit 100 according to the present embodiment. FIG. 2 shows the constitution of the electronic equipment 200 that loads the current-voltage conversion circuit 100 in FIG. 1.

In FIG. 2, the electronic equipment 200 includes a battery 10, a load circuit 30, and the power consumption detector 180. The battery 10 generates battery voltage Vbat. The load circuit 30 is driven by the battery 10. The power consumption detector 180 is provided on a driving path of the load circuit 30 and detects the power consumption of the load circuit 30.

The power consumption detector 180 has a current-voltage conversion circuit 100 that includes a detection resistor Rdet, an A/D converter 50 and a processing unit 70.

The current-voltage conversion circuit 100 has an input and an output terminals, a first terminal 102, a second terminal 104 and an output terminal 106. As detailed in FIG. 1, the current that flows to the load circuit 30 from battery 10 is converted into voltage and amplified. The A/D converter 50 A/D-converts the output voltage Vout of the current-voltage conversion circuit 100. The processing unit 70 specifies the power consumption at the load circuit 30 using the A/D-converted voltage. In addition, the processing unit 70 specifies the remaining capacity of the battery 10 from the power consumption of the load circuit 30.

Here, the current supplied from the battery 10 to the load circuit 30 is a battery current Ibat, the voltage between the first terminal 102 and the second terminal 104 is an input voltage Vi.

The battery 10 is connected to the first terminal 102 of the current-voltage conversion circuit 100. The detection Resistor Rdet is provided between the first terminal 102 and the second terminal 104. The second terminal 104 is connected to the load circuit 30. Here, the resistance value of the detection resistor Rdet is set to a small value between several m$\Omega$ and several dozen m$\Omega$ in order to supply the maximum power to the load circuit 30. Therefore, the battery voltage Vbat and the battery current Ibat are supplied most to the load circuit 30. The output terminal 106 of the current-voltage conversion circuit 100 is connected to the A/D converter 50. The A/D converter 50, for example, uses 2.85V at 10 bit full scale. The output of the A/D converter 50 is input into the processing unit 70.

The current voltage conversion circuit 100 amplifies an input voltage Vi to a desired value, and outputs the amplified voltage to the output terminal 106. "The desired value" is decided according to the number of bits that the A/D converter 50 converts into and the full scale thereof. For example, a 10-bit A/D converter with 2.85V full scale produces an output voltage of 0V when fed an input voltage less than 2.8 mV. Therefore, the current voltage conversion circuit 100 amplifies the input voltage Vi, which represents the battery current Ibat to be detected, so as to exceed 2.8 mV.

In FIG. 1, the current-voltage conversion circuit 100 has the detection resistor Rdet which converts the battery current Ibat into the input voltage Vi, the amplifier 120 which amplifies the input voltage Vi, and the offset adjusting current source 150 connected to the amplifier 120.

The amplifier 120 and the offset adjusting current source 150 are integrated on one semiconductor substrate.

The amplifier 120 has a first resistor R1, a first transistor M1, a second resistor R2, a first operational amplifier 108 and an offset resistor Rofs.

The first resistor R1, the first transistor M1, and the second resistor R2 are connected in series between the first terminal 102 which is the high voltage end of the detection resistor Rdet and the ground which is the first fixed voltage terminal. The first transistor M1 is a p-channel MOSFET (Metal-Oxide Semiconductor Field Effect Transistor) in the embodiment. As for the first operational amplifier 108, the output terminal thereof is connected to the control terminal of the first transistor M1. The inverting input terminal thereof is connected to the connecting node between the first resistor R1 and the first transistor M1. The offset resistor Rofs is provided between the second terminal 104 which is the lower voltage end of the detection resistor Rdet and the non-inverting input terminal of the first operational amplifier 108. The voltage at the connection node between the first transistor M1 and the second resistor R2 is output from the terminal 106 as the output voltage Vout.

Here, the voltage which occurs in the first resistor R1 being V1, the current which flows through the first resistor R1 being I1, the voltage which occurs across the offset resistor Rofs being an offset adjustment voltage Vofs, the current which flows through the offset resistor Rofs being an offset adjustment current Iadj, and an offset voltage of the first operational amplifier 108 are inscribed as ΔV. The offset adjustment current Iadj flows from the offset adjusting current source 150.

With the current-voltage conversion circuit 100 being formed in this way, the first operational amplifier 108 maintains the balance state with the feedback mechanism of the first resistor R1 and the first transistor M1. Thus, "the imaginary short" is formed between the inverting input terminal and the non-inverting input terminal of the first operational amplifier 108. Therefore, using the current I1 that flows through the first resistor R1, the offset adjustment voltage which occurs in the offset resistor Rofs, and the offset voltage ΔV of the first operational amplifier 108, the output voltage Vout is expressed as;

$$Vout = R2 \times I1 \quad (1)$$

$$R2 \times (Vi + Vofs + \Delta V)/R1$$

Furthermore, throughout the expressions, the references indicating the resistors are also used to denote their resistance value (e.g., the resistance of the first resistor R1 is indicated by R1). It will be learned from expression (1) that controlling the offset adjustment voltage Vofs such that Vofs=−ΔV results in $$Vout=(R2/R1) \times Vi \quad (2)$$

which shows that and input voltage Vi, namely, the voltage applied to the detection resistance Rdet, is amplified by a factor defined by a ratio between the resistance of the first resistor R1 and that of the second resistor R2. Since the first resistor R1 and the second resistor R2 are formed as pairing resistors on one semiconductor substrate, the resistance ratio between the first resistor R1 and the second resistor R2 is almost precisely as designed. "Pairing" means closely arranging multiple elements of identical type on one semiconductor substrate so as to ensure that, with regard to their characteristics, the elements exhibit the same production error and temperature-dependent fluctuation. As for the offset adjustment voltage Vofs, the offset adjusting current Iadj that flows to the offset resistor Rofs is controlled according to the current source 150 for offset adjustment that is described in detail below.

The offset adjusting current source 150 has a reference voltage circuit 152, a third resistor R3, a fourth resistor R4, a second transistor M2, a fifth resistor R5 and a second operational amplifier 154.

The reference voltage circuit 152 for example is a band gap reference circuit and a highly accurate reference voltage Vref is generated. The third resistor R3 and the fourth resistor R4 divide the reference voltage Vref that is output from the reference voltage circuit 152. The second transistor M2 and the fifth resistor R5 is connected in series between the non-inverting input terminal of the first operational amplifier 108 and to a ground terminal which is a second fixed voltage terminal. The second transistor M2 uses N-channel MOSFET in the embodiment. As for the second operational amplifier 154, the divided voltage of the reference voltage Vref is inputted to the non-inverting input terminal and the inverting input terminal is connected to the connection node of the second transistor M2 and the fifth resistor R5. The output terminal of the second operational amplifier 154 is connected to the control terminal of the second transistor M2.

The third resistor R3 and the fourth resistor R4 are trimmable, for example it has been designed so that laser trimming can adjust the resistance value. As trimming procedure, while looking at the output of the A/D converter 50, when the known current flows to the load circuit 30 from the battery 10, the resistance values of the third resistor R3 and fourth resistor R4 are adjusted by laser trimming. It may also be possible to perform an adjustment so as to satisfy expression (2).

With the offset adjusting current source 150 being formed in this way, the reference voltage Vref is divided by the third resistor R3 and the fourth resistor R4, and the divided reference voltage Vref is input to the non-inverting input terminal of the second operational amplifier 154. In addition, the second operational amplifier 154 maintains the balanced state by the feedback mechanism with the second transistor M2 and the fifth resistor R5. Thus, "the imaginary short" between the inverting input terminal and the non-inverted of the second operational amplifier 154 is established.

Therefore, the offset adjustment electric current Iadj is;

$$Iadj=Vref'/R5 \quad (3).$$

The divided reference voltage Vref' is;

$$Vref'=Vref \times R4/(R3+R4) \quad (4)$$

Therefore, by adjusting the resistance value of at least one of the third resistor R3 and the fourth resistor R4 and by adjusting the magnitude of the divided reference voltage Vref', a desired offset adjustment electric current Iadj can be obtained. When we assume that the input impedance of the first operational amplifier 108 is sufficiently high, Vofs=Rofs×Iadj. Therefore, by adjusting the resistance value of at least one of the third resistor R3 and the fourth resistor R4, a desirable offset adjustment voltage Vofs can be generated. By controlling the offset adjustment voltage Vofs and canceling the offset voltage ΔV of the first operational amplifier 108 accordingly, no undetectable current region is created in amplifying the input voltage Vi due to the offset voltage of the first operational amplifier 108.

Figure 3:
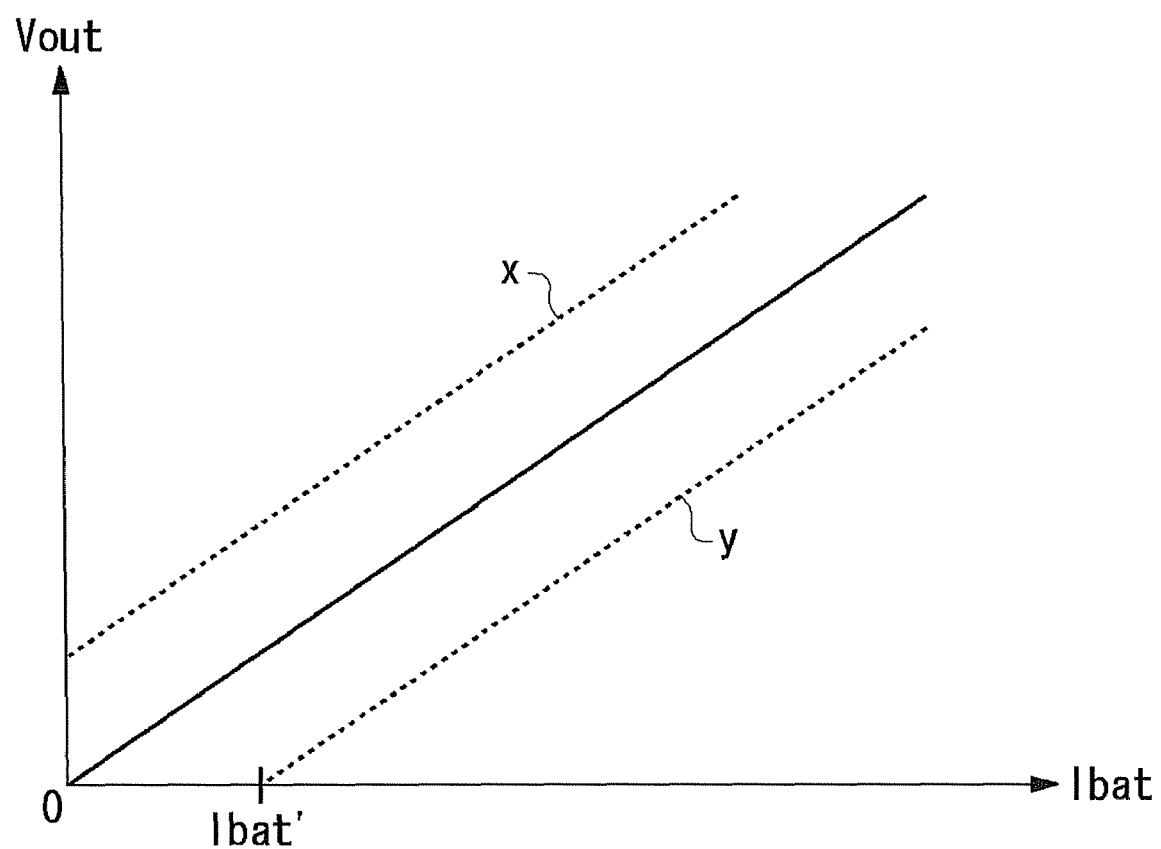
FIG. 3 is the figure showing the relationship between the input current Ibat and output voltage Vout.

FIG. 3 shows an example of the relationship between the battery current Ibat and the output voltage Vout. The solid line indicates the relationship obtained when there is no offset voltage ΔV of the first operational amplifier 108 which is used in amplification. When the battery current Ibat is 0, the output voltage is also 0, exhibiting an ideal relationship in which, as the battery current Ibat increases, the output voltage Vout is linearly increased. But, due to the influence of the offset voltage ΔV of the operational amplifier 108 that is included in current voltage conversion circuit 100, the relationship between the battery current Ibat and the output voltage Vout deviates from the ideal relationship, as shown by broken line x or broken line y. Broken line y shows a case where the electric potential of the inverting input terminal is higher than the electric potential of the non-inverting input terminal. In this case, when the magnitude of the battery current Ibat is smaller than Ibat', (Ibat<Ibat'), the output voltage Vout becomes 0 even though the battery current Ibat is supplied. Namely, the region of undetectable current exists because of the influence of the first operational amplifier 108's offset voltage ΔV.

With the present embodiment, by adjusting the resistance value of at least one of the third resistor R3 and the fourth resistor R4, the offset adjustment voltage Vofs can be controlled so that expression (2) is satisfied. Therefore, in an identical case where there is no offset voltage ΔV of the first operational amplifier 108, the ideal relationship that is shown by the solid line in FIG. 3 can be obtained.

According to the embodiment, in conjunction to the offset resistor Rofs adjusted by resistance value of the third resistor R3 and fourth resistor R4 in the offset adjusting current source 150, it is possible to let the optional size of the offset adjustment current flow, and since the optional size of adjusted voltage Vofs can be generated, it can prevent a region of undetectable current even when there is little battery current (Ibat). Therefore, the current-voltage conversion circuit 100 can execute current-voltage conversion with precise detection.

In addition, the offset adjustment voltage Vofs can be controlled so as to satisfy expression (2). In this case, a directly proportional relation between the battery current Ibat and the output voltage Vout is obtained. As a result, the processing unit 70 is capable of utilizing the output of the A/D converter 50 without correction, which makes the power consumption detector 180 and electrical component 200 simple and low-cost.

In addition, because the current-voltage conversion circuit 100 is capable of precise current-voltage conversion, the processing unit 70 of the power consumption detector 180 accurately specifies the power consumption at the load circuit 30.

As a result, the processing unit 70 can specify accurately the remaining capacity of the battery 10, making battery supervision easy.

The embodiment described above is an illustration, and various deformation examples are possible in the combination of each of those components, and the fact that experts in this field understand such deformation examples are within the scope of this invention.

For example, P-channel MOSFET was used as the first transistor M1 and N-channel MOSFET was used as the second transistor M2 in the embodiment, but it is not limited to this use.

A PNP type bipolar transistor or the like may replace the P type MOSFET to implement the first transistor M1 so long as imaginary short is established between the inverting input terminal and the non-inverting input terminal of the first operational amplifier 108 and a feedback operation is achieved. An NPN type bipolar transistor or the like may replace the N type MOSFET to implement the second transistor M2 so long as imaginary short is established between the inverting input terminal and the non-inverting input terminal of the second operational amplifier 154 and a feedback operation is achieved. These selections may be made depending on the semiconductor production process employed to design a circuit, circuit scale or the like.

In the embodiment, the third resistor R3 and the fourth resistor R4 both are trimmable in the offset adjusting current source 150 but, not being limited to this, at least one of the third resistor R3 and the fourth resistor R4 should be trimmable. Alternatively, at least one of the third resistor R3 and the fourth resistor R4 may be trimmable so long as the reference voltage Vref, which is the output of reference voltage circuit 152, is optionally divided. Furthermore, it may also be formed so the fifth resistor R5 is capable of trimming.

In the embodiment, all of the components consisting of the amplifier 120 and the offset adjusting current source 150 are integrated on one semiconductor substrate, but this too is not limited, it may consist of partial or all of the discrete parts. The decision to integrate parts may be based cost and the possession area etc.

In addition with the embodiment, an example concerning the use of the current-voltage conversion circuit 100 in battery driven electronic equipment such as portable mobile phones and portable CD players etc. was explained, but it is not limited even to this. The current-voltage conversion circuit can be used for all aspects in converting and amplifying the input current into voltage.

While the preferred embodiments of the present invention have been described using specific terms, such description is for illustrative purposes only, and it is to be understood that changes and variations may be made without departing from the spirit or scope of the appended claims.

The invention claimed is:

1. A current-voltage conversion circuit which converts a current to be detected into a voltage, comprising:
   a detection resistor provided on a path through which the current to be detected flows;
   a first resistor, a first transistor and a second resistor connected in series between a high-potential first terminal of the detection resistor and a first fixed voltage terminal;
   a first operational amplifier which has its output terminal connected to the control terminal of the first transistor, and has its inverting input terminal connected to a node between the first resistor and the first transistor;
   an offset resistor which is provided between a low-potential second terminal of the detection resistor and the non-inverting input terminal of the first operational amplifier;
   an offset adjusting current source which includes a trimmable resistor and causes an offset adjustment current to flow in the offset resistor, the current value of the offset adjustment current being controlled by adjusting the resistance of the resistors, wherein
   a voltage at a node between the first transistor and the second resistor is output.

2. The current-voltage conversion circuit according to claim 1, wherein
   the offset adjusting current source comprises:
   a reference voltage circuit;
   third and fourth resistors which divide a reference voltage output from the reference voltage circuit;
   a second transistor and a fifth resistor connected in series between the non-inverting input terminal of the first operational amplifier and a second fixed voltage terminal; and
   an operational amplifier which receives the reference voltage at the non-inverting input terminal, has its inverting input terminal connected to a node between the second transistor and the fifth resistor, and has its output terminal connected to the control terminal of the second transistor, wherein
   at least one of the third resistor and the fourth resistor is trimmable.

3. The current-voltage conversion circuit according to claim 1, wherein the first resistor, the second resistor, the first operational amplifier, the offset resistor and the offset adjusting current source are integrated on a semiconductor substrate.

4. A power consumption detection circuit comprising:

the current-voltage conversion circuit according to claim 1 which detects a current that flows in a load circuit;

an analog to digital converter which subjects an output voltage of the current-voltage conversion circuit to analog to digital conversion; and a processing unit which determines power consumption of the load circuit by referring to the value of the output voltage subjected to analog to digital conversion by the analog to digital converter.

5. Electronic equipment comprising:

a battery;

a load circuit driven by the battery; and the power consumption detection circuit according to claim 4 which detects power consumption of the load circuit, wherein the processing unit of the power consumption detection circuit determines the remaining capacity of the battery by referring to the power consumption of the load circuit.

* * * * *